(12) United States Patent
Fan

(10) Patent No.: US 7,996,018 B1
(45) Date of Patent: Aug. 9, 2011

(54) LOCATION SPECIFIC IN-VEHICLE FREQUENCY TUNING DATA

(75) Inventor: Rodric C. Fan, Fremont, CA (US)

(73) Assignee: Trimble Navigation Limited, Sunnyvale, CA (US)

( * ) Notice: Subject to any disclaimer, the term of this patent is extended or adjusted under 35 U.S.C. 154(b) by 447 days.

(21) Appl. No.: 09/705,564

(22) Filed: Nov. 3, 2000

(51) Int. Cl.
*H04W 24/00* (2009.01)
*H04M 3/42* (2006.01)
*H04L 29/06* (2006.01)
*H04L 29/08* (2006.01)

(52) U.S. Cl. ............. 455/456.3; 455/414.1; 455/414.2; 455/414.3; 455/414.4; 455/456.1

(58) Field of Classification Search ........... 455/414.1, 455/456.1, 158.4, 45, 456.2, 419, 445, 186.1, 455/186.2, 3.04, 458, 414.2, 456.3; 701/200, 701/208; 340/988, 989; 342/357.13, 387
See application file for complete search history.

(56) References Cited

U.S. PATENT DOCUMENTS

| | | | | |
|---|---|---|---|---|
| 5,303,401 A * | 4/1994 | Duckeck et al. | ........... | 455/186.1 |
| 5,640,696 A * | 6/1997 | Ishikawa et al. | ........... | 455/186.2 |
| 5,819,166 A * | 10/1998 | Kimura et al. | ............ | 455/186.1 |
| 5,852,610 A * | 12/1998 | Olaniyan | ...................... | 370/486 |
| 5,864,753 A * | 1/1999 | Morita et al. | .............. | 455/186.1 |
| 5,903,844 A * | 5/1999 | Bruckert et al. | ........... | 455/456.2 |
| 6,181,921 B1 * | 1/2001 | Konisi et al. | ............... | 455/186.2 |
| 6,282,412 B1 * | 8/2001 | Lyons | ......................... | 455/186.1 |
| 6,374,177 B1 * | 4/2002 | Lee et al. | ....................... | 701/200 |
| 6,535,743 B1 * | 3/2003 | Kennedy et al. | ............ | 455/456.1 |
| 6,728,531 B1 * | 4/2004 | Lee et al. | ...................... | 455/419 |
| 6,766,361 B1 | 7/2004 | Venigalla | | |
| 6,795,741 B2 * | 9/2004 | Simon | ............................. | 700/94 |
| 2002/0046084 A1 * | 4/2002 | Steele et al. | .................... | 705/14 |
| 2007/0142945 A1 * | 6/2007 | Beckmann et al. | .............. | 700/94 |

FOREIGN PATENT DOCUMENTS

| | | | |
|---|---|---|---|
| CA | 2270321 A1 * | 4/1999 | |
| EP | 0 813 302 A1 | 12/1997 | |
| EP | 0813302 A1 * | 12/1997 | |
| EP | 0 964 514 A1 | 12/1999 | |
| EP | 0964514 A1 * | 12/1999 | |
| GB | 2 364 217 A | 1/2002 | |
| JP | 10-150374 | * | 6/1998 |
| JP | 11-215017 | * | 8/1999 |
| WO | WO 00/45511 | 8/2000 | |
| WO | WO 01/22112 A1 | 3/2001 | |
| WO | WO 01/22633 A1 | 3/2001 | |
| WO | WO-2003/060712 | 7/2003 | |
| WO | WO-2004/114144 | 12/2004 | |

* cited by examiner

*Primary Examiner* — Patrick N Edouard
*Assistant Examiner* — Huy C Ho

(57) ABSTRACT

An in-vehicle system comprises a location unit, a frequency selection unit, and a receiving unit. Frequency tuning data is loaded into the selection unit. The frequency tuning data includes a radio signal reception area for each unique frequency in the tuning data. The location unit determines the system location and passes the location information to the frequency selection unit. The selection unit selects tuning data for a particular frequency having a signal reception area that encompasses the present vehicle location, and passes the selected data to the receiving unit. The receiving unit uses the selected tuning data to tune the radio signal.

21 Claims, 2 Drawing Sheets

LOCATION SPECIFIC IN-VEHICLE FREQUENCY TUNING DATA

BACKGROUND

1. Field of the Invention

Embodiments pertain to in-vehicle radio frequency signal reception, and more particularly to providing signal tuning information for signal reception areas in which the vehicle is located.

2. Related Art

Many motor vehicles (e.g., automobiles, trucks) are equipped with radio receivers that receive radio signals from commercial radio broadcast stations (e.g., AM, FM). These radio receivers are typically equipped with means (e.g., conventional pushbuttons located on the receiver's front panel) that allow a radio listener to select one of several preselected radio frequencies for tuning and listening to content carried by the signal. At a particular geographic position, therefore, the listener may choose among several preselected commercial radio broadcast stations whose radio signal reception areas encompass the receiver's position. FIG. 1 illustrates motor vehicle 10 operating within reception area 12 of a signal broadcast by commercial broadcast transmitter 14. When in reception area 12, an occupant of vehicle 10 presses a pushbutton to select the signal frequency of transmitter 14.

Since the number of available preselected tuning frequencies is typically limited, when a motor vehicle is moved outside the signal reception areas of the broadcast stations whose frequencies have been preselected by the listener, the listener must then manually select broadcast signal frequencies for new signal reception areas. As illustrated in FIG. 1, for example, as vehicle 10 travels (depicted by the arrow) beyond reception area 12, the listener must find (e.g., manually tune or use a frequency scanning feature) frequencies in coverage areas 16 and 18 in order to receive signals from transmitters 20 and 22, respectively.

It is often difficult for a listener operating a vehicle outside of a home listening area (e.g., area 12) to discover one or more commercial radio stations that broadcast subject matter in which the listener is interested. While many in-vehicle radio receivers have a frequency scan feature, this feature often does not lock on to low power broadcast station signals, or to signals in acceptable but weak signal reception areas. Or, the scan feature locks on to a station during broadcast of an advertisement or other non-content related subject, so that 1.5 the listener is unable to determine the commercial broadcast content format (e.g., rock and roll music, classical music, news) of the locked-on signal. A listener traveling in vehicle 10 who normally listens to classical music in home reception area 12 must then tune to many different frequencies in reception areas 16,18 in order to continue listening to, for example, classical music. Similarly, a listener who travels to reception area 18 and who wants to receive local information (e.g., motor vehicle traffic information for highways within area 18) will have a difficult time determining which broadcast stations within area 18 transmit such local information. It is therefore desirable to provide a way for a motor vehicle radio listener to determine what radio frequencies are available at a particular geographic location, and furthermore to identify stations that broadcast in certain subject format categories at the location.

SUMMARY

A radio signal receiving system includes a location unit, a frequency selection unit, and a receiving unit. Radio signal tuning data is loaded into the selection unit. The tuning data includes data for tuning to particular radio signal frequencies and the reception area for each signal. The location unit determines the receiving system's geographic position and passes the position information to the frequency selection unit. The selection unit then determines in which radio signal reception areas the system is located. In some embodiments the tuning information is grouped by radio signal content categories such that the selection unit may select tunable frequencies in one or more particular content categories as the system is moved through changing signal reception areas. In some embodiments the tunable content categories, and/or information about the tunable signals, are output as a menu for listener selection. In other embodiments, tuning to receive a particular content category is automatic upon reaching a new reception area.

DETAILED DESCRIPTION

Figure 2:
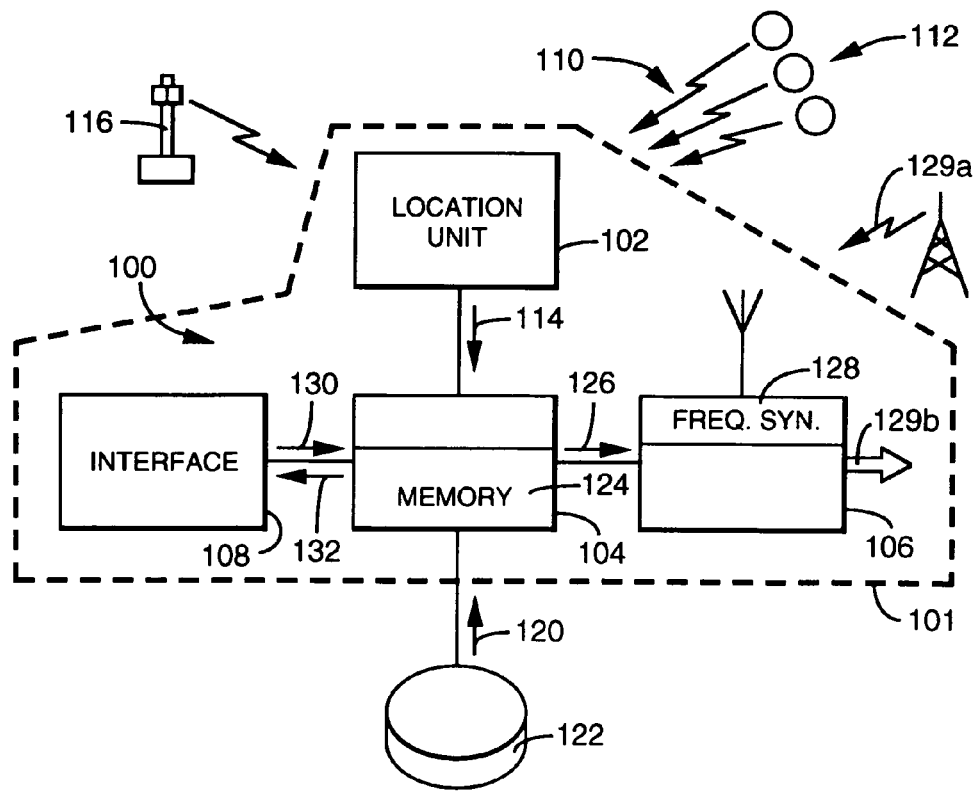
FIG. 2 is a diagrammatic view of an embodiment of the invention.

FIG. 2 is a functional block diagram of an embodiment of the invention. As depicted in FIG. 2, receiving system 100 is positioned in a motor vehicle, represented by dashed line 101. System 100 includes location unit 102, frequency selection unit 104, receiving unit 106, and listener interface 108.

In some embodiments location unit 102 is a conventional global positioning system (GPS) receiver that receives signals 110 from satellites in GPS constellation 112. Signals 110 include pseudo-range information that location unit 102 uses to conventionally determine the geographic position of system 100. Information 114 identifying system 100's position is output from location unit 102 to frequency selection unit 104. In other embodiments location unit 102 determines geographic position by using corrected GPS information received from local GPS correction stations (not shown). U.S. Pat. No. 5,959,577 discloses the use of GPS correction stations and is incorporated herein by reference. In still other embodiments location unit 102 determines geographic position by using conventional information in a signal received from conventional cellular wireless (radio) communications system tower 116. For example, a conventional cellular telephone handset (not shown) is electrically coupled to location unit 102 so that unit 102 receives and/or determines position information from signals transmitted by cellular communications system antenna tower 116. In this instance, system 100's location is determined to be within the signal reception area of signals transmitted from tower 116.

Selection unit 104 receives position information 114, from location unit 102. Selection unit 104 also receives frequency tuning data 120 from database 122 and stores the data 120 in conventional memory 124. Tuning data 120 is described in detail below. Various procedures are used to transfer (download) tuning data 120 from database 122 to memory 124. For example, in some instances the information is transferred using a conventional direct wired electrical connection (e.g., coupled to a computer via a cable). In other instances tuning data 120 is transferred via a conventional link through the Internet (network of interconnected networks having its origin in research done by the United States Advanced Research Projects Agency). Frequency selection unit 104 includes a conventional microprocessor/microcontroller and, as described below, uses position information 114 and tuning data 120 to select the frequency of a transmitter having a signal reception area within which system 100 is positioned. Programming to control selection unit 104, as well as units 102, 106, and 108, is routing in light of this specification.

Selection unit 104 outputs selected frequency data 126 to receiving unit 106. In the embodiment shown in FIG. 2, conventional frequency synthesizer 128 uses data 126 so that receiving unit 106 properly tunes to receive the selected content-containing radio signal 129a. Receiving unit 106 extracts the content from signal 129a and outputs the content to the listener as audio program 129b.

In some embodiments selection unit 104 receives one or more listener commands 130 from listener interface 108. Commands 130 are made in response to selected information 132 output on interface 108, such as a broadcast subject category menu, received by interface 108 from selection unit 104.

TABLE I shows an illustrative embodiment of frequency tuning data 120. As shown in TABLE I, tuning data 120 is arranged by subject content category and by geographic area. The content categories are illustrative of many possible categories. The "xxx.x" represents one of many possible radio frequencies, such as one of the 101 available U.S. commercial FM radio frequencies. The frequencies are not limited to signals having one particular transmission form, but may refer to several broadcast forms such as commercial FM radio, AM radio, government weather reports, or other broadcast services operating in frequency spectra such as television separate audio programming or sidebands of commercial radio broadcast transmission frequencies.

TABLE I

| | Content Category | | | |
|---|---|---|---|---|
| Geo. Area | Classical | Rock & Roll | Traffic | Weather |
| A (12) | xxx.x | xxx.x | xxx.x | xxx.x |
|  | xxx.x | xxx.x |  |  |
|  |  | xxx.x |  |  |
| B (16) | xxx.x | xxx.x | xxx.x | — |
|  |  | xxx.x |  |  |
|  |  | xxx.x |  |  |
| C (18) | xxx.x | xxx.x | — | xxx.x |
|  | xxx.x |  |  |  |

The geographic area is the transmission signal coverage area. In some cases the geographic area is circular, centered on the broadcast antenna location, with a radius that is determined by the power of the broadcast transmitter. In other cases, such as for satellite transmissions discussed below, the circular geographic area is centered on the ground aim point of the satellite antenna. In other cases the geographic area is a more complex shape, determined for example by actual field measurement of broadcast signal reception.

As shown in TABLE I, classical music is available on two frequencies in geographic area A, rock & roll music on three frequencies, local (i.e., relevant to area A) motor vehicle traffic information on one frequency, and local weather information on one frequency. In geographic area B, classical music is available on one frequency, rock & roll music on three frequencies, local (i.e., relevant to area B) motor vehicle traffic information on one frequency, but no local weather information is available. In geographic area C, classical music is available on two frequencies, rock & roll music on one frequency, local (i.e., relevant to area C) weather information on one frequency, but no local motor vehicle traffic information is available. Particular frequencies may be listed in more than one content category (e.g., both "Rock & Roll" and "Pop. Music" categories), depending on a station's particular program content format.

Figure 1:
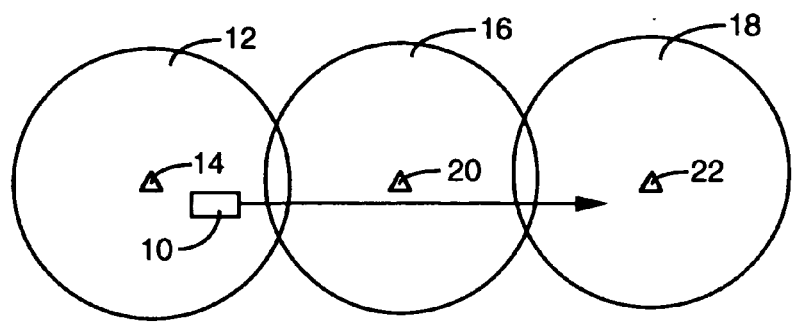
FIG. 1 is a diagrammatic plan view of several radio signal reception areas.

Referring again to FIG. 1 and continuing this example of tuning data 120, TABLE I geographic area A corresponds to broadcast reception area 12, area B to 16, and area C to 18. System 100 provides the occupant of motor vehicle 10 who wants to listen to classical music while traveling through areas 12,16,18 with classical music signal tuning information in all three areas 12,16,18. While in reception area 12, selection unit 104 (FIG. 2) outputs the two area 12 classical music frequencies as selected information 132. The listener inputs a command 130 to selection unit 104 which, in response to the command, outputs selected tuning data 126 to receiving unit 106. Receiving unit 106 then tunes to the selected frequency and outputs the signal content to the listener. Similarly, in reception area 16 the one classical music frequency is made available for selection and is output as data 126. And likewise in reception area 18, the two available classical music frequencies are made available for selection, and the selected frequency is output as data 126. Frequency tuning for the other content categories is similarly made available for selection as vehicle 10 passes through areas 12,16,18.

In some embodiments the broadcast content categories made available in frequency tuning data 120 are customized to a particular user preference. For example, a particular user accesses via the Internet a site on the world-wide-web that includes many content categories for the radio signal reception areas. The particular user selects one or more content categories of interest (e.g., classical music, local traffic information, local weather information) on the web site. The frequency tuning information is then formatted (using, e.g., a conventional server associated with the web site) and downloaded as data 120.

Available content categories are output using interface 108 as, for example, a menu of categories. In some embodiments the output is made using a conventional visual display (e.g., liquid crystal) while in other embodiments the output is audible using a conventional audio output (e.g., synthesized or digitally recorded speech). The user then selects the content category he or she wishes to tune by using, for example, manual pushbutton inputs or verbal commands received by a conventional voice recognition system included in interface 108. This selection is output to selection unit 104 as command 130.

In some embodiments interface 108 also outputs as a menu the particular available frequencies for the reception area in which system 100 is currently located. Thus the listener may select among the available frequencies for a particular content category by using, as before, manual or verbal commands that are transformed and output as command 130. In some embodiments tuning data 120 includes a brief description giving more specific broadcast format information for each available frequency. Thus when the listener selects, for example, the rock & roll content category, interface 108 outputs to the user that one rock & roll broadcast station format is "classic rock," another station is "oldies," and still another station format is "modern rock." Thus available frequencies in one or more particular content categories may be continuously updated for listener selection.

In other embodiments, however, when system 100 leaves one signal reception area in which the listener is receiving output in a particular content category, selection unit 104 automatically selects a frequency in the same particular content category when entering the new signal reception area.

Thus the listener continuously receives output in a particular content category. Tuning to new signals in some instances may be prompted by geographic position, or in other instances by received signal strength. One particularly worthwhile application of this automatic tuning feature is providing localized (e.g., within cellular communications cells near the listener's position) coverage area motor vehicle traffic information to drivers. Drivers entering a city from one direction, for example, are typically unconcerned with traffic conditions on the opposite side of the city. Thus by using system 100 a driver may receive vehicle traffic information within, for example, 30 minutes of driving time from the present location.

Figure 3:
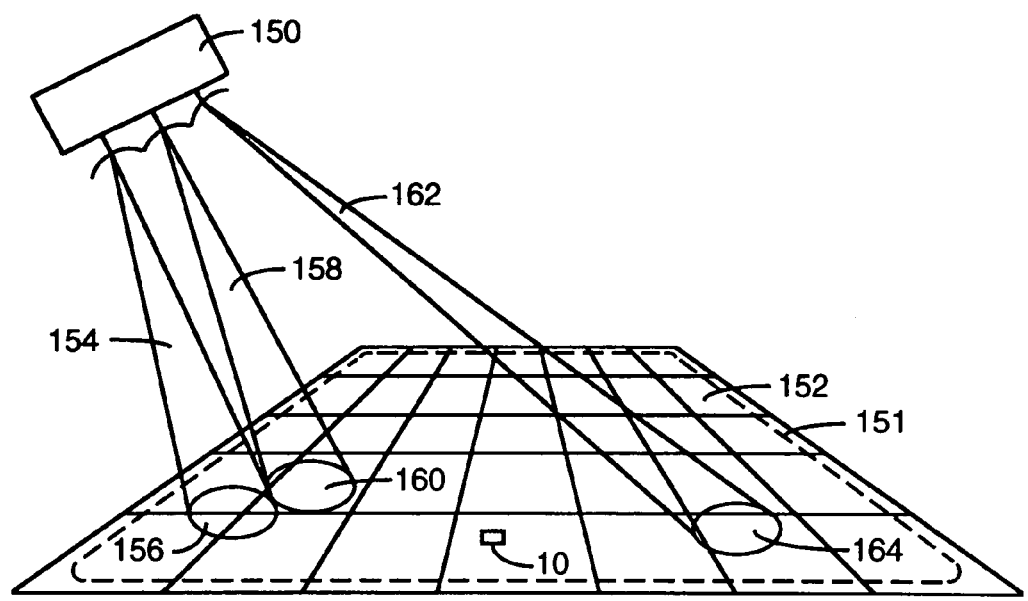
FIG. 3 is a diagrammatic perspective view of several satellite radio signal reception areas.

Some embodiments of this invention are used to provide frequency tuning data for commercial direct satellite broadcast. Referring to FIG. 3, communications satellite 150 broadcasts on one or more radio frequencies for wide geographic reception area 151 on the surface of the earth 152. Satellite 150 also transmits three "spot" radio frequency beams aimed at different points on the earth 152. These spot beams carry, for example, information relevant to the small frequency reception area on the earth. As shown in FIG. 3, radio frequency beam 154 has reception area 156, beam 158 has reception area 160, and beam 162 has reception area 164. Reception areas 156,160 are adjacent, and so the beams 154, 158 frequencies are different to prevent signal interference. Reception area 164 is distant from reception area 156, and so beams 154,162 may have the same radio frequency. Motor vehicle 10 receives tuning information for beams 154,158, 162 as it travels through reception areas 156,160,164, respectively, as well as tuning information for area 151.

The present invention is not limited to the specific embodiments discussed above. For example, other embodiments may be used to provide coverage for maritime vessels or aircraft. Furthermore, embodiments are not limited to receiving audio information, but may be used to receive, for example, video, text, or information for synthesized speech output.

I claim:

1. A location-specific frequency tuning system comprising:
   a location unit;
   a wireless interface to a wide area network;
   a user interface;
   a mobile receiving unit configured for tuning to receive a broadcast signal based on a selected frequency provided as input to the mobile receiving unit; and
   a frequency selection unit coupled to said mobile receiving unit, said frequency selection unit configured for: receiving a current location from the location unit, receiving tuning data comprising a set of frequencies of broadcast signals corresponding to different geographic regions through the wireless interface at the current location from a database on the wide area network, selecting a plurality of frequencies from the set of frequencies of broadcast signals based on the strength of said plurality of frequencies, arranging said plurality of frequencies by subject content categories and geographic areas corresponding to said plurality of frequencies based on user-selected content category information, selecting localized content information from said arranged plurality of frequencies when said system moves to a new reception area among a plurality of reception areas, said selected localized content information comprising a plurality of localized content-specific frequencies corresponding to said user-selected content category information and said new reception area, and said selected localized content information further comprising a description of specific broadcast format information for each of said plurality of localized content-specific frequencies, generating a menu listing said selected localized content information, outputting said menu to a user through said user interface, selecting one of said plurality of localized content-specific frequencies based on a user selection, and tuning said mobile receiving unit to said selected localized content-specific frequency.

2. The system of claim 1 wherein the selected frequency is the transmission frequency of a frequency modulated (FM) broadcast station.

3. The system of claim 1 wherein the selected frequency is a transmission frequency of a satellite transmitter.

4. The system of claim 1 further comprising receiving from the frequency selection unit data arranged as radio signal content categories, and to output a menu of the radio signal content categories to a listener.

5. The system of claim 1 wherein at least a portion of the menu is output on a visual display.

6. The system of claim 1 wherein at least a portion of the menu is audibly output by the user interface.

7. The system of claim 1 further comprising a user interface electrically coupled to receive and relay to the frequency selection unit a user command to select a particular content category in an arrangement of radio signal content categories stored in the frequency selection unit.

8. The system of claim 7 wherein the command is a verbal command.

9. The system of claim 1, wherein the geographic position information is provided using global positioning system information.

10. The system of claim 1, wherein the geographic position information is provided using cellular wireless communications system information.

11. A method of tuning location-specific frequency data in a mobile signal receiving unit using a frequency selection unit coupled to said mobile signal receiving unit, said method comprising:
   receiving geographic position information from a location unit, said geographic position information identifying a present geographic position of said mobile signal receiving unit
   receiving tuning data from a remote database said tuning data comprising a set of frequencies of broadcast signals corresponding to different geographic frequencies;
   receiving user-selected content category information;
   determining a plurality of reception areas in which said system is located based on said geographic position information and said tuning data;
   selecting localized tuning data based on signal strength for a plurality of available frequencies having a signal reception area corresponding to at least one of said plurality of reception areas, said localized tuning data corresponding to signals having several broadcast forms;
   arranging said localized tuning data by subject content categories associated with said plurality of available frequencies and geographic areas corresponding to each of said plurality of reception areas;
   selecting localized content information from said arranged localized tuning data when said system moves to a new reception area among said plurality of reception areas, said selected localized content information comprising a plurality of localized content-specific frequencies corresponding to said user-selected content category information and said new reception area, and said selected localized content information further comprising a description of specific broadcast format information for each of said plurality of localized content-specific frequencies;

generating a menu listing said selected localized content information;

outputting said menu to a user through a user interface;

prompting said user interface for a user selection;

selecting one of said plurality of localized content-specific frequencies based on a user selection; and tuning said mobile signal receiving unit to said selected localized content-specific frequency.

12. The method of claim 11, wherein the tuning data comprises frequency modulated (FM) radio station frequencies.

13. The method of claim 11, wherein the tuning data comprises satellite transmission radio frequencies.

14. The method of claim 11, wherein the tuning data is arranged by categories of content carried by radio signals.

15. The method of claim 14 further comprising the act of outputting to a user a menu of content categories available for the current position.

16. The method of claim 14 further comprising the act of receiving a command from a listener to select a particular content category.

17. The method of claim 11, wherein said user-selected content category information is provided by a system user selecting one or more content categories via the Internet and wherein the tuning data is provided by downloading via the Internet.

18. The method of claim 17, wherein the user selects the one or more content categories via the World-Wide Web.

19. The method of claim 11, wherein the geographic position information is provided using global positioning system information.

20. The method of claim 11, wherein the geographic position information is provided using cellular wireless communications system information.

21. The method of claim 11, wherein the localized tuning data is selected based on a content category of a broadcast signal being received prior to a change in signal reception condition.

* * * * *